(12) United States Patent
Ikeda

(10) Patent No.: US 7,521,277 B2
(45) Date of Patent: Apr. 21, 2009

(54) METHOD FOR MANUFACTURING SEMICONDUCTOR DEVICE WITH LOW TEMPERATURE DOPANT ACTIVATION

(75) Inventor: Harumi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/176,564

(22) Filed: Jul. 7, 2005

(65) Prior Publication Data
US 2006/0009018 A1    Jan. 12, 2006

(30) Foreign Application Priority Data
Jul. 12, 2004 (JP) .......................... P2004-205058

(51) Int. Cl.
*H01L 21/00* (2006.01)
(52) U.S. Cl. .................. 438/57; 438/622; 257/E21.347
(58) Field of Classification Search .................. 438/57, 438/622, 78; 257/292, E27.133, E21.347
See application file for complete search history.

(56) References Cited

U.S. PATENT DOCUMENTS

| | | | | |
|---|---|---|---|---|
| 4,234,356 A | * | 11/1980 | Auston et al. | 438/799 |
| 4,436,557 A | * | 3/1984 | Wood et al. | 438/89 |
| 6,339,013 B1 | * | 1/2002 | Naseem et al. | 438/491 |
| 2002/0006689 A1 | * | 1/2002 | Miyasaka | 438/149 |
| 2002/0020840 A1 | * | 2/2002 | Nakajima | 257/57 |
| 2002/0055207 A1 | * | 5/2002 | Kunii | 438/151 |

* cited by examiner

*Primary Examiner*—Michelle Estrada
*Assistant Examiner*—Jarrett J Stark
(74) *Attorney, Agent, or Firm*—Sonnenschein Nath & Rosenthal LLP

(57) ABSTRACT

A doped region in a semiconductor substrate is activated by irradiation of electromagnetic waves having a main spectrum peak at a wavelength of 1.1 μm or less. The efficiency of electromagnetic wave absorption of the silicon substrate increases in use of such electromagnetic waves in comparison with heat treatment using conventional infrared light, such as a tungsten halogen lamp. Accordingly, only a desired very small area in the substrate can be locally heated with a region using a thermally unstable material maintained at a temperature of 400° C. or less. For example, activation can be performed after forming a metal or alloy layer or an insulating interlayer over the semiconductor substrate, or after bonding an adhesive coating film and a support substrate to the semiconductor substrate.

12 Claims, 3 Drawing Sheets

METHOD FOR MANUFACTURING SEMICONDUCTOR DEVICE WITH LOW TEMPERATURE DOPANT ACTIVATION

CROSS PREFERENCE TO RELATED APPLICATIONS

The present invention contains subject matter related to Japanese Patent Application JP 2004-205058 filed in the Japanese Patent Office on Jul. 12, 2004, the entire contents of which are incorporated herein by reference.

BACKGROUND OF THE INVENTION

1. Field of the Invention

The present invention relates to a method for manufacturing a semiconductor device in which a doped region in a semiconductor is activated after forming an element unstable particularly to high-temperature heat treatment (thermally unstable region).

2. Description of the Related Art

When a doped active region, such as a well region or a channel region, is formed in a semiconductor substrate in a process for manufacturing a semiconductor device, two steps are generally performed: the step of doping the semiconductor substrate; and the step of activating the dopant.

For the activation, heat treatment is performed at 400° C. or more to increase the activation efficiency and to improve the crystallinity of the doped region.

However, the heat treatment at 400° C. or more should be avoided for aluminium and other metal layers and adhesive coating films. Hence, it is difficult to activate the dopant after the formation of a metal layer or an adhesive coating film in such a known process.

SUMMARY OF THE INVENTION

Therefore the known process of semiconductor manufacturing, in which heat treatment for activating the dopant in the semiconductor substrate is performed after the formation of a metal layer or an adhesive coating film, places a constraint on selecting the material of the metal layer or adhesive coating film and, in some cases, interferes with enhancing the performance of the device.

Accordingly, the object of the present invention is to provide a method for manufacturing a semiconductor device in which dopant can be activated after using a material unstable to high-temperature heat treatment (thermally unstable material) so that the performance of the resulting device can be enhanced.

According to an embodiment of the present invention, there is provided a method for manufacturing a semiconductor device which includes: the doping step of introducing a dopant into a semiconductor substrate; the forming step of forming a thermally unstable region over the semiconductor substrate; and the activation step of activating the dopant after the doping step and the forming step.

In the activation step, activation is performed by irradiation of electromagnetic waves having a main spectrum peak at a wavelength of 1.1 μm or less.

DESRIPTION OF THE PREFERRED EMBODIMENTS

In the semiconductor device manufacturing method of the present invention, the doped region in the semiconductor substrate is activated by irradiation of electromagnetic waves having a main spectrum peak at a wavelength of 1.1 μm or less. Such irradiation allows the silicon substrate to absorb the electromagnetic waves more efficiently than known electromagnetic wave irradiation mainly using infrared light, such as a tungsten halogen lamp. Consequently, only a desired very small area in the substrate can be heated to activate, so that the temperature of regions formed of thermally unstable materials can be maintained at 400° C. or less.

Thus, it becomes possible to form, for example, an aluminium layer or other metal or alloy layer or an insulating interlayer over the semiconductor substrate before activation, or to bond an adhesive coating film and a support substrate to the semiconductor substrate before activation. Thus, the ranges of choices in material and process step can be increased to enhance the performance.

The semiconductor substrate may be heated before, during, or after activation without particular limitation. For the activation, annealing may be performed with a lamp emitting electromagnetic waves having a main spectrum peak at a wavelength of 1.1 μm or less, or with an electromagnetic wave laser having a wavelength of 1.1 μm or less.

The activation may be performed with a combination of the electromagnetic waves having a main spectrum peak at a wavelength of 1.1 μm or less and electromagnetic waves having no main spectrum peak in the range of 1.1 μm or less. In this instance, the electromagnetic waves having no main peak in the range of 1.1 μm or less are used for rapidly heating the area to be activated with the silicon substrate maintained at a temperature of 400° C. or less; hence, such electromagnetic waves are used as an auxiliary to the electromagnetic waves having a main spectrum peak at a wavelength of 1.1 μm or less. Appropriate electromagnetic waves having no main spectrum peak in the range of 1.1 μm or less can be selected according to the equipment, the device structure, or the like.

The doping is performed by ion implantation. The doping forms a doped region in the semiconductor substrate. The doped region is used for forming a desired pn junction or a desired carrier concentration region by the activation performed in a subsequent step. For example, source/drain regions and source/drain extension regions may be formed for a MOS transistor. The desired carrier concentration region refers to, for example, a heavily doped region formed in a lightly doped region.

In addition, the step of forming a coating film may be performed before the irradiation of electromagnetic waves for activation so that the electromagnetic waves are partially absorbed by the coating film. Thus, the increase in temperature of the thermally unstable material can be further prevented effectively.

Embodiment 1

Figure 1:
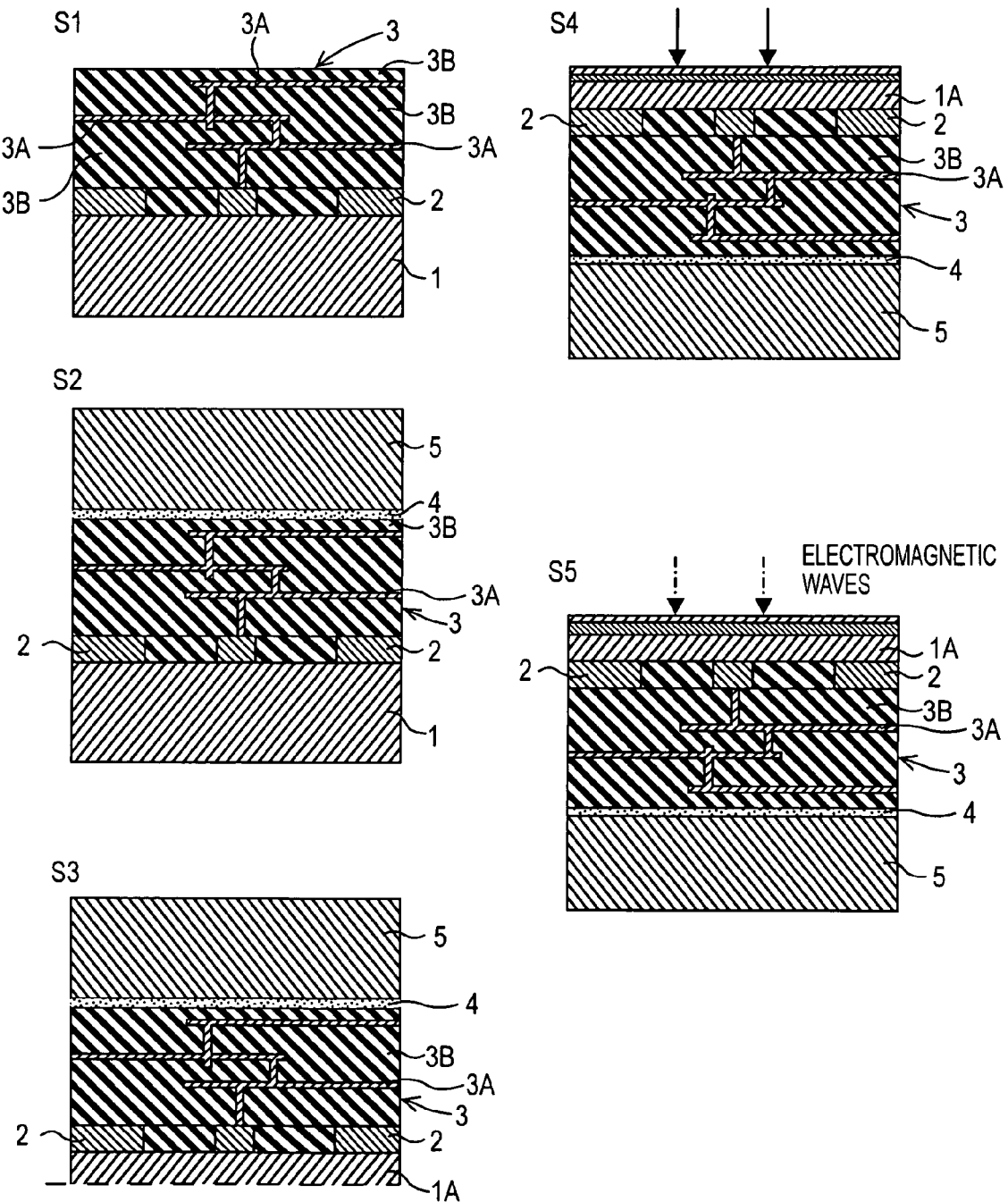
FIG. 1 is a sectional view of a method for manufacturing a semiconductor device according to Embodiment 1 of the present invention.
Figure 2A:
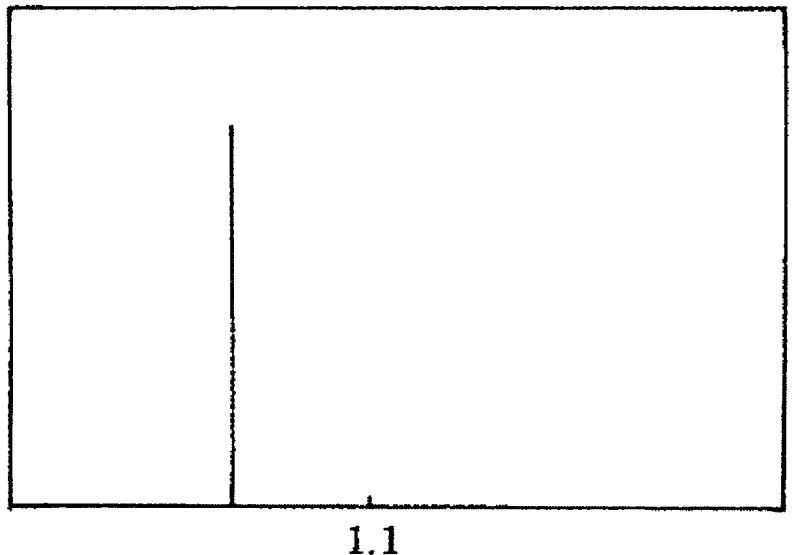
FIGS. 2A and 2B are exemplary spectra of electromagnetic waves emitted for activation.
Figure 2B:
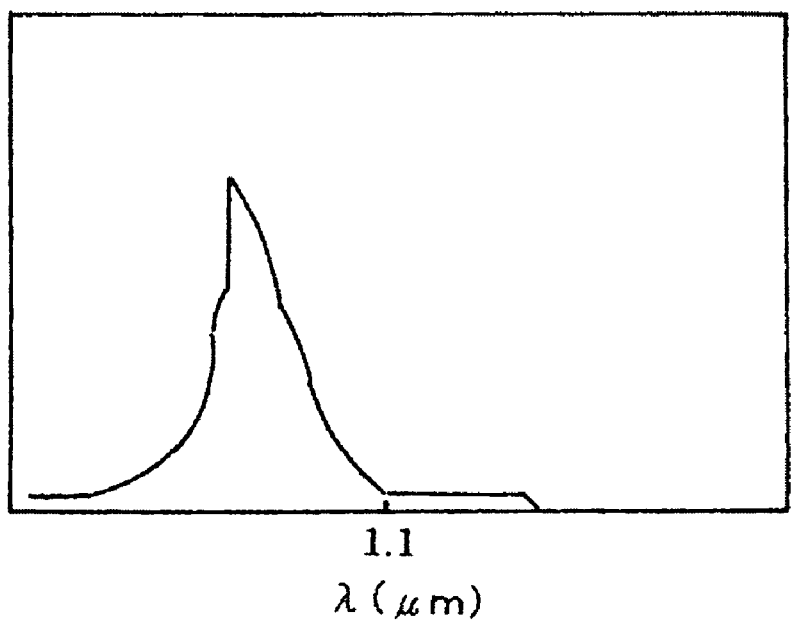

FIG. 1 is a sectional view of steps of a semiconductor device manufacturing method according an embodiment of the present invention. FIGS. 2A and 2B show spectra of electromagnetic waves emitted for activation. FIG. 2A is a profile of a laser spectrum, and FIG. 2B is a profile of a lamp spectrum. The following process will be described with reference to steps S1 to S5 of FIG. 1.

In step S1 of FIG. 1, a MOS transistor 2 is formed in the upper portion of the silicon substrate 1, and then, a multilayer wiring film 3 is formed on the surface of the MOS transistor 2. The multilayer wiring film includes three wiring layers 3A of, for example, aluminium and four insulating interlayers 3B of, for example, silicon oxide. The wring layers may be formed of a metal other than aluminium, such as titanium, a metal alloy, or a composite. The insulating interlayer may be partially made of silicon nitride.

Turning to step S2 of FIG. 1, an adhesive coating film 4 is formed over the upper surface of the multilayer wiring film 3, and a support substrate 5 is bonded to the multilayer wiring film 3 with the adhesive coating film therebetween.

Turning to step S3 of FIG. 1, a lower portion of the silicon substrate 1 is removed by a physical or chemical process to form a thin silicon layer 1A. In this instance, the thickness of the silicon layer 1A is set at, for example, 40 µm or less.

Then, in step S4 of FIG. 1, the thin silicon layer 1A is doped by ion implantation from a surface of the thin silicon layer 1A opposite to the forming surface of the multilayer wiring on the semiconductor substrate, to form a doped region. In this step, generally used ions, such as boron or phosphorus ions, may be used according to the polarity of the region (for example, a pn junction region) to be formed. In the case shown in FIG. 1, the ion implantation may be performed at a depth of, for example, 1 µm or less and at a relatively low dopant concentration of $10^{16}$ to $10^{19}$ cm$^{-1}$. The present invention is not, however, limited to these conditions.

Turning to step S5 of FIG. 1, the doped layer formed in step S4 is irradiated with electromagnetic waves having a spectrum peak at a wavelength of 1.1 µm or less to activate the doped layer.

As shown in FIGS. 2A and 2B, the electromagnetic waves are emitted from, for example, a laser or lamp having a main spectrum peak at a wavelength of 1.1 µm or less.

The laser may be a continuous laser, such as a He—Ne laser (wavelength: 632.8 nm), or a pulsed laser, such as a XeCl excimer laser (wavelength: 308 nm). The lamp may be a mercury lamp, a xenon lamp, or a halogen lamp.

For example, the doped layer is irradiated twice with 100 ns pulsed laser waves at an energy density of 1.5 J·cm$^{-2}$ while being heated at 300° C., in the present embodiment. It however goes without saying that the method of the present invention is not limited to these conditions.

Thus, the doped layer formed in step S4 can be activated without heating to 400° C. or more the thermally unstable multilayer wiring film 3 including the wires and insulating interlayers and the adhesive coating film 4.

In the embodiment described above, the support substrate 5 is bonded to the multilayer wiring film 3 overlying the silicon substrate 1, with the adhesive coating film 4 therebetween, and then the thickness of the silicon substrate 1 is reduced to form the thin silicon layer 1A. The silicon layer 1A is subjected to the ion implantation and irradiated with electromagnetic waves for activation, through the rear surface of the multilayer wiring film 3. This process is an example and the present invention can be applied to extremely various processes.

For example, the ion implantation and the electromagnetic wave irradiation may be performed from the right side of wiring layers, or the support substrate may not be used. Also, ion implantation may be performed before the formation of wiring layers and the activation may be performed after the formation of the wiring layers.

The thermally unstable material provided before the irradiation may be exposed at the surface to be irradiated with the electromagnetic waves, depending on the structure of the semiconductor device. In such a case, a mask may be used in the optical system so that a specific region is not irradiated with the electromagnetic waves, as used in the known exposure apparatus. Alternatively, the shifting of the material to be irradiated or the scanning of laser waves may be controlled while the laser waves are processed to a microscopic beam in the optical system.

As described above, in the method for manufacturing a semiconductor device of the present invention, the dopant introduced into the semiconductor substrate is activated by irradiation of electromagnetic waves having a main spectrum peak at a wavelength of 1.1 µm or less. Since such electromagnetic waves exhibit high absorption coefficient in the silicon substrate, only a very small area of the substrate can be locally heated to activate. Therefore, the activation can be performed with the thermally unstable region maintained at a temperature of 400° C. or less.

Thus, the dopant can be activated after a step providing a thermally unstable material. Accordingly, the manufacturing process can be modified as desired so that the performance of the device is enhanced.

Since the energy band gap E of silicon is about 1.1 eV at 300 K, and the relationship E=1.24/λ holds between band gap E and wavelength λ, the wavelength λ converted from the band gap E is about 1.1 µm. Thus, the electromagnetic waves with a wavelength of 1.1 µm or less are absorbed at the edge of the band gap. On the other hand, if the wavelength of the electromagnetic waves increases beyond 1.1 µm, the efficiency of electromagnetic wave absorption of the silicon substrate decreases rapidly. Consequently, it becomes difficult to heat a desired very small area so as to activate with high efficiency.

Figure 3:
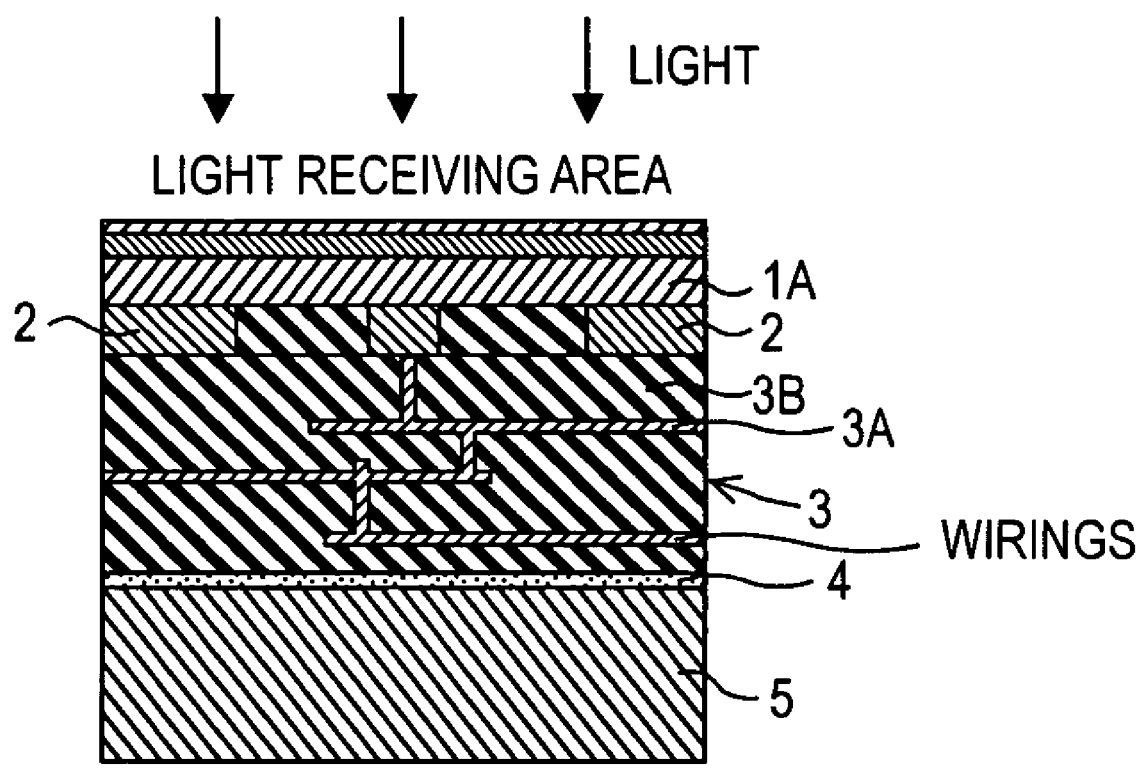
FIG. 3 is a sectional vies of a semiconductor device of an imaging function to which the present invention is applied.

Also, it is preferable to apply the present invention to some particular semiconductor devices of imaging function like a CMOS image pick up device, a camera and an imaging module product. FIG. 3 is a block diagram showing an example of a configuration of CMOS image pickup device, a camera or an imaging module to which the present invention is applied.

On these devices, it is extremely sensitive to the imaging function to define the size of light receiving area and profile of impurity materials introduced in the light receiving area. And these imaging devices have wirings to drive some transistors related to the read-out function of the imaged information. The wirings are easily affected by heat used when the imaging devices are manufactured to define the size of light receiving area and the profile of impurity materials introduced in the light receiving area.

Accordingly, with the present invention, the size of light receiving area and the profile of impurity materials introduced in the light receiving area are modified and fixed with heat appropriately without damaging the wirings.

What is claimed is:

1. A method for manufacturing a semiconductor device comprising the steps of:
    forming a multilayer wiring film including wiring layers and insulating layers on a semiconductor substrate;
    introducing a dopant into the semiconductor substrate, from a surface of the semiconductor substrate opposite to the forming surface of the multilayer wiring on the semiconductor substrate, to form a doped region;
    forming a thermally unstable region over the doping side of the semiconductor substrate; and
    activating the dopant without heat treating the thermally unstable region at or greater than 400° C., wherein,
the activation is performed by irradiating the dopant with a combination of electromagnetic waves having a main spectrum peak at a wavelength of 1.1 μm or less and an energy density of about 1.5 J.cm$^{-2}$ and electromagnetic waves having no main spectrum peak in the wavelength range of 1.1 μm or less, and the irradiation is performed from the side of the semiconductor substrate opposite to the forming side of the multilayer wiring on the semiconductor substrate, to form a doped region.

2. The method for manufacturing a semiconductor device according to claim 1, wherein the forming step includes the step of forming a metal or an alloy layer over the semiconductor substrate.

3. The method for manufacturing a semiconductor device according to claim 1, wherein the forming step forms an insulating interlayer over the semiconductor substrate.

4. The method for manufacturing a semiconductor device according to claim 1, wherein the forming step is performed by bonding an adhesive coating film and a support substrate to the semiconductor substrate.

5. The method for manufacturing a semiconductor device according to claim 1, wherein activating the dopant forms a pn junction in the doped region.

6. The method for manufacturing a semiconductor device according to claim 1, wherein a carrier concentration region is formed in the activation step.

7. The method for manufacturing a semiconductor device according to claim 1, wherein the doping step is performed by ion implantation.

8. The method for manufacturing a semiconductor device according to claim 1, wherein the activation is performed by annealing with a lamp emitting electromagnetic waves having a main spectrum peak at a wavelength of 1.1 μm or less.

9. The method for manufacturing a semiconductor device according to claim 1, wherein the activation is performed by annealing with a laser emitting electromagnetic waves having a main spectrum peak at a wavelength of 1.1 μm or less.

10. The method for manufacturing a semiconductor device according to claim 1, further comprising the step of forming a coating film partially absorbing the electromagnetic waves before irradiation of the electromagnetic waves for the activation.

11. The method for manufacturing a semiconductor device according to claim 5, wherein the doped region for the pn junction includes source/drain regions and source/drain extension regions of a MOS transistor.

12. A method for manufacturing an imaging device comprising the steps of:
forming a multilayer wiring film including wiring layers and insulating layers on a semiconductor substrate;
introducing a dopant into the semiconductor substrate, from a surface of the semiconductor substrate opposite to the forming surface of the multilayer wiring on the semiconductor substrate, to form a doped region;
forming wirings over the doping side of the semiconductor substrate; and
activating the dopant without heat treating doped the semiconductor substrate at or greater than 400° C.,
wherein,
the activation is performed by irradiating the dopant with a combination of electromagnetic waves having a main spectrum peak at a wavelength of 1.1 μm or less and an energy density of about 1.5 J.cm$^{-2}$ and electromagnetic waves having no main spectrum peak in the wavelength range of 1.1 μm or less, and
the irradiation is performed from the surface of the semiconductor substrate opposite to the forming surface of the multilayer wiring on the semiconductor substrate.

* * * * *